United States Patent
Pei

(10) Patent No.: US 8,608,854 B2
(45) Date of Patent: Dec. 17, 2013

(54) CVD DEVICE

(75) Inventor: Shao-Kai Pei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 870 days.

(21) Appl. No.: 12/767,026

(22) Filed: Apr. 26, 2010

(65) Prior Publication Data

US 2011/0155055 A1   Jun. 30, 2011

(30) Foreign Application Priority Data

Dec. 24, 2009   (TW) ................................ 98144651 A

(51) Int. Cl.
| | | |
|---|---|---|
| C23C 16/455 | (2006.01) | |
| C23C 16/458 | (2006.01) | |
| C23C 16/46 | (2006.01) | |
| C23C 16/48 | (2006.01) | |
| C23F 1/00 | (2006.01) | |
| H01L 21/306 | (2006.01) | |
| C23C 16/06 | (2006.01) | |
| C23C 16/22 | (2006.01) | |

(52) U.S. Cl.
USPC . 118/724; 118/715; 156/345.33; 156/345.37; 156/345.51; 156/345.52

(58) Field of Classification Search
USPC ............... 118/724, 715; 156/345.33, 345.37, 156/345.51, 345.52
See application file for complete search history.

(56) References Cited

U.S. PATENT DOCUMENTS

| | | | | |
|---|---|---|---|---|
| 3,391,270 | A * | 7/1968 | Buchter et al. | 219/385 |
| 3,460,510 | A * | 8/1969 | Currin | 118/720 |
| 3,594,227 | A * | 7/1971 | Oswald | 438/782 |
| 3,633,537 | A * | 1/1972 | Howe | 118/725 |
| 3,637,434 | A * | 1/1972 | Nakanuma et al. | 117/98 |
| 3,645,230 | A * | 2/1972 | Hugle et al. | 118/730 |
| 3,856,654 | A * | 12/1974 | George | 204/298.07 |
| 3,865,072 | A * | 2/1975 | Kirkman | 118/663 |
| 4,268,374 | A * | 5/1981 | Lepselter | 204/298.31 |
| 4,298,443 | A * | 11/1981 | Maydan | 204/192.32 |
| 4,325,778 | A * | 4/1982 | Lepselter | 438/729 |
| 4,328,068 | A * | 5/1982 | Curtis | 216/60 |
| 4,422,407 | A * | 12/1983 | Bessot et al. | 118/723 E |
| 4,468,283 | A * | 8/1984 | Ahmed | 117/102 |
| 4,491,509 | A * | 1/1985 | Krause | 204/192.12 |
| 4,522,149 | A * | 6/1985 | Garbis et al. | 118/725 |
| 4,565,157 | A * | 1/1986 | Brors et al. | 118/719 |
| 4,596,208 | A * | 6/1986 | Wolfson et al. | 118/712 |
| 4,615,294 | A * | 10/1986 | Scapple et al. | 118/50.1 |
| 4,638,762 | A * | 1/1987 | Kim et al. | 118/725 |
| 4,823,736 | A * | 4/1989 | Post et al. | 118/730 |

(Continued)

FOREIGN PATENT DOCUMENTS

| | | | | | |
|---|---|---|---|---|---|
| CN | 1375575 | A | | 10/2002 | |
| JP | 59075621 | A | * | 4/1984 | ............ H01L 21/205 |
| JP | 62036812 | A | * | 2/1987 | ............ H01L 21/205 |
| JP | 03194920 | A | * | 8/1991 | ............ H01L 21/205 |

*Primary Examiner* — Rudy Zervigon

(74) *Attorney, Agent, or Firm* — Altis Law Group, Inc.

(57) ABSTRACT

A CVD device includes a reaction chamber, a support device, a gas input assembly and a gas output device. The support device is positioned in the reaction chamber. The gas input assembly and a gas output assembly are connected to the reaction chamber respectively. The gas input assembly includes a main body positioned in the reaction chamber and a plurality of gas jets uniformly positioned on the main body, introducing mixed gas to the reaction chamber uniformly.

13 Claims, 4 Drawing Sheets

(56) References Cited

U.S. PATENT DOCUMENTS

| | | | | |
|---|---|---|---|---|
| 4,848,272 A | * | 7/1989 | Ohmura et al. | 118/725 |
| 4,976,216 A | * | 12/1990 | Maeda et al. | 118/728 |
| 5,002,011 A | * | 3/1991 | Ohmine et al. | 118/725 |
| 5,023,188 A | * | 6/1991 | Tanaka | 438/8 |
| 5,104,276 A | * | 4/1992 | Severns et al. | 414/222.03 |
| 5,116,181 A | * | 5/1992 | Severns et al. | 414/222.03 |
| 5,119,540 A | * | 6/1992 | Kong et al. | 118/730 |
| 5,121,531 A | * | 6/1992 | Severns et al. | 29/25.01 |
| 5,129,360 A | * | 7/1992 | Ahern et al. | 118/724 |
| 5,149,375 A | * | 9/1992 | Matsuyama | 118/719 |
| 5,151,133 A | * | 9/1992 | Ohmine et al. | 118/725 |
| 5,155,336 A | * | 10/1992 | Gronet et al. | 219/411 |
| 5,200,016 A | * | 4/1993 | Namose | 156/345.25 |
| 5,256,449 A | * | 10/1993 | Suzuki et al. | 427/248.1 |
| 5,288,364 A | * | 2/1994 | Burt et al. | 117/86 |
| 5,328,513 A | * | 7/1994 | Suzuki et al. | 118/715 |
| 5,350,455 A | * | 9/1994 | Mahler | 118/728 |
| 5,374,159 A | * | 12/1994 | Severns et al. | 414/806 |
| 5,376,180 A | * | 12/1994 | Mahler | 118/728 |
| 5,378,284 A | * | 1/1995 | Geisler et al. | 118/723 MR |
| 5,421,979 A | * | 6/1995 | Stevenson | 204/298.25 |
| 5,444,207 A | * | 8/1995 | Sekine et al. | 219/121.43 |
| 5,453,233 A | * | 9/1995 | Teverovsky et al. | 264/81 |
| 5,484,486 A | * | 1/1996 | Blackburn et al. | 118/728 |
| 5,629,245 A | * | 5/1997 | Inushima et al. | 216/13 |
| 5,843,234 A | * | 12/1998 | Finn et al. | 118/715 |
| 5,855,970 A | * | 1/1999 | Inushima et al. | 427/579 |
| 5,892,886 A | * | 4/1999 | Sandhu | 392/416 |
| 5,968,277 A | * | 10/1999 | Landin et al. | 118/730 |
| 6,005,225 A | * | 12/1999 | Kowalski et al. | 219/390 |
| 6,013,338 A | * | 1/2000 | Inushima et al. | 427/579 |
| 6,037,273 A | * | 3/2000 | Gronet et al. | 438/773 |
| 6,110,289 A | * | 8/2000 | Moore | 118/725 |
| 6,113,733 A | * | 9/2000 | Eriguchi et al. | 156/345.24 |
| 6,129,048 A | * | 10/2000 | Sullivan | 118/728 |
| 6,159,866 A | * | 12/2000 | Gronet et al. | 438/769 |
| 6,210,484 B1 | * | 4/2001 | Hathaway | 118/724 |
| 6,390,019 B1 | * | 5/2002 | Grimbergen et al. | 118/723 R |
| 6,747,249 B2 | * | 6/2004 | Robinson et al. | 219/389 |
| 6,758,941 B1 | * | 7/2004 | Ookawa et al. | 156/345.47 |
| 7,020,981 B2 | * | 4/2006 | Shero et al. | 34/366 |
| 7,051,671 B2 | * | 5/2006 | Aoki et al. | 118/723 E |
| 7,462,246 B2 | * | 12/2008 | Hellwig | 118/728 |
| 7,485,189 B2 | * | 2/2009 | Satake et al. | 118/689 |
| 7,540,923 B2 | * | 6/2009 | Takagi et al. | 118/666 |
| 7,976,634 B2 | * | 7/2011 | Carlson et al. | 118/724 |
| 8,257,547 B2 | * | 9/2012 | Pei | 156/345.51 |
| 8,388,753 B2 | * | 3/2013 | Pei | 118/719 |
| 8,404,049 B2 | * | 3/2013 | Hellwig et al. | 118/728 |
| 8,448,598 B2 | * | 5/2013 | Pei | 118/623 |
| 2004/0040655 A1 | * | 3/2004 | Yuasa | 156/345.5 |
| 2006/0231035 A1 | * | 10/2006 | Hellwig | 118/728 |
| 2009/0017637 A1 | * | 1/2009 | Huang et al. | 438/758 |

\* cited by examiner

CVD DEVICE

BACKGROUND

1. Technical Field

The present disclosure relates generally to CVD and, more particularly, to a CVD device having a plurality of gas jets.

2. Description of Related Art

In a chemical vapor deposition (CVD), reactive material, under gas treatment, deposits solid material on a solid substrate.

A CVD device plays an important role in such process. That is, uniformity and purity of a deposition film of the solid end product is decided by the CVD device. The CVD device generally includes an gas input assembly, a gas output device, and a reaction chamber. The gas input assembly is connected to a gas input orifice of the CVD device. A support member for supporting the solid substrate is positioned in the reaction chamber. In use, mixed gas passes into the reaction chamber until the reaction chamber is full of the mixed gas. The mixed gas reacts with light or heat, and solid material is deposited on the solid substrate.

However, the CVD device has only one gas input for air, thus uniform density of the mixed gas is difficult to achieve in the reaction chamber. That is, a density of a region adjacent to the gas input orifice exceeds that of a region away from the gas input orifice, and thickness of the deposition film may not be uniform.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
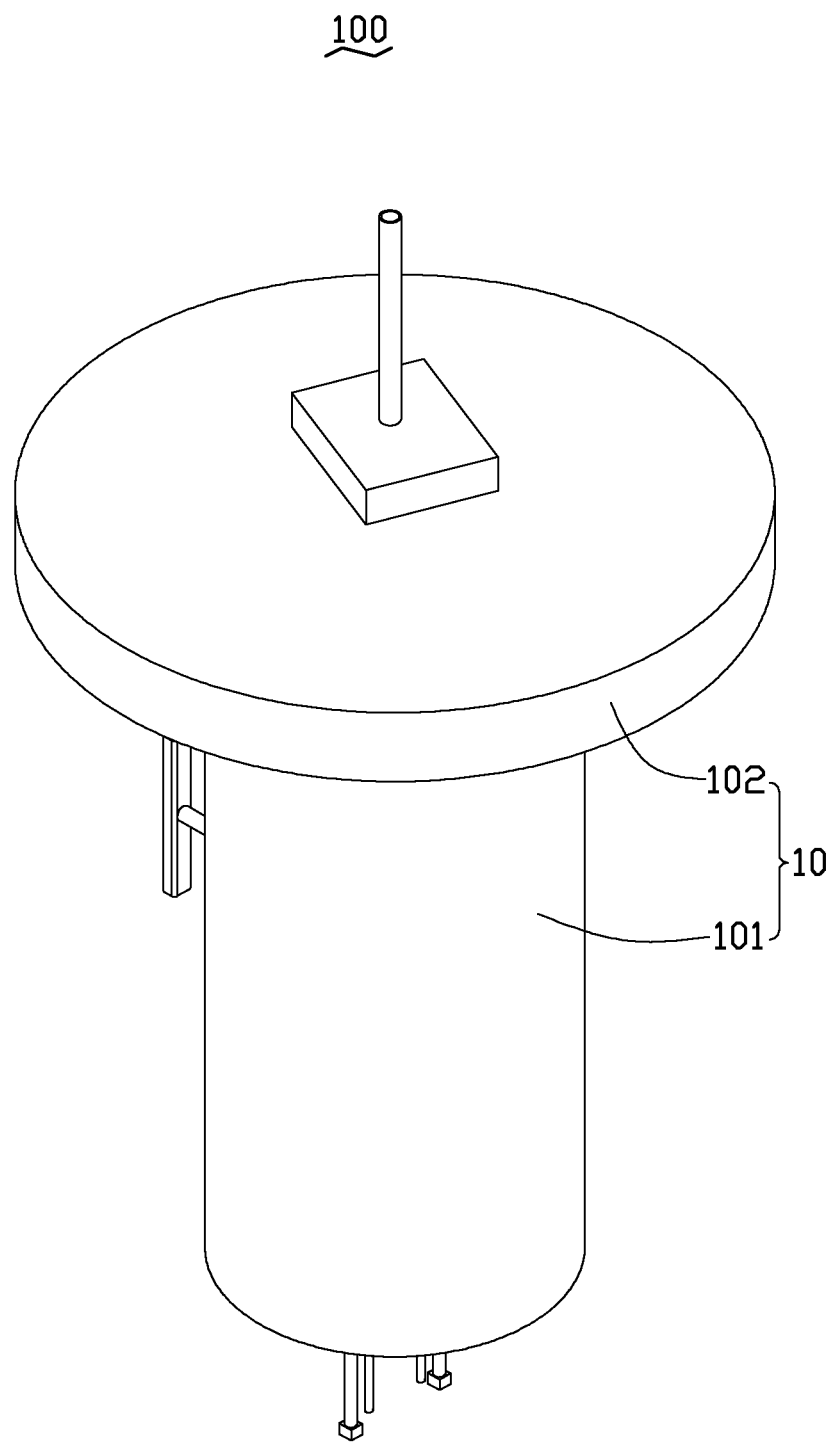
FIG. 1 is an assembled, isometric view of an embodiment of a CVD device.
Figure 2:
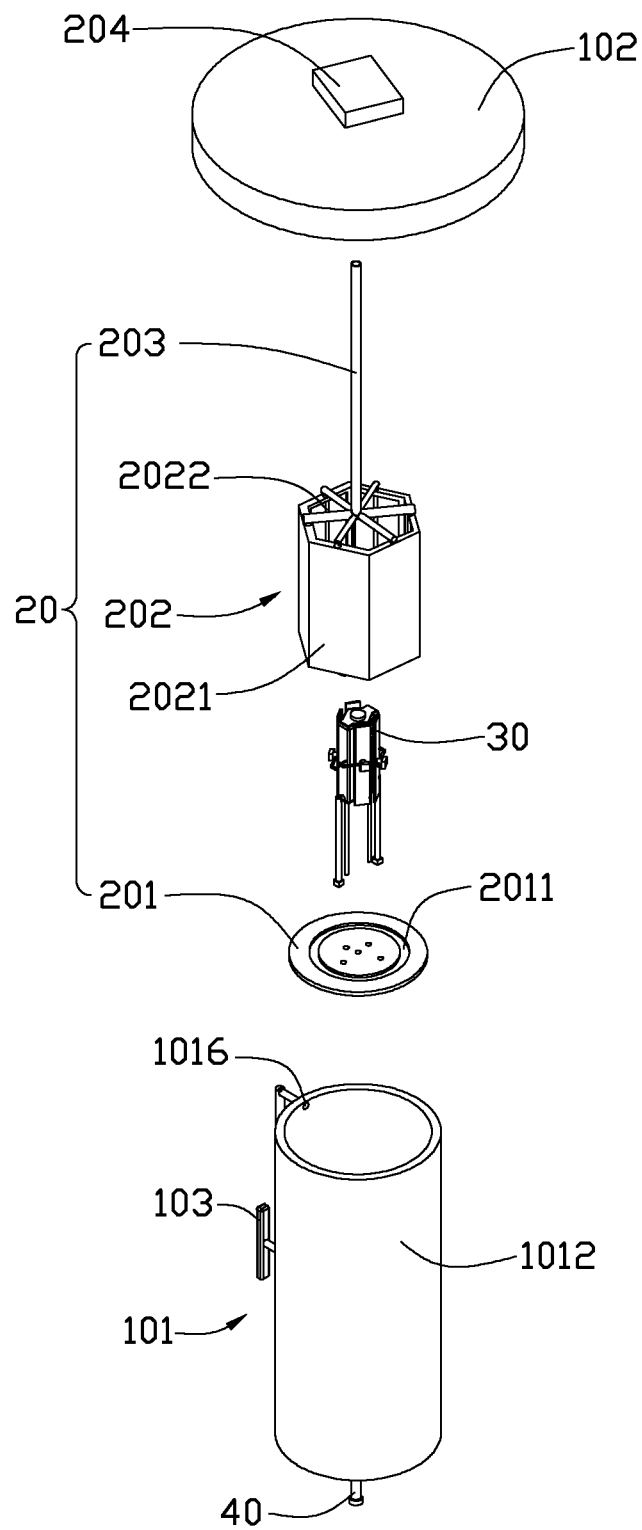
FIG. 2 is an exploded, isometric view of the CVD device of FIG. 1.
Figure 3:
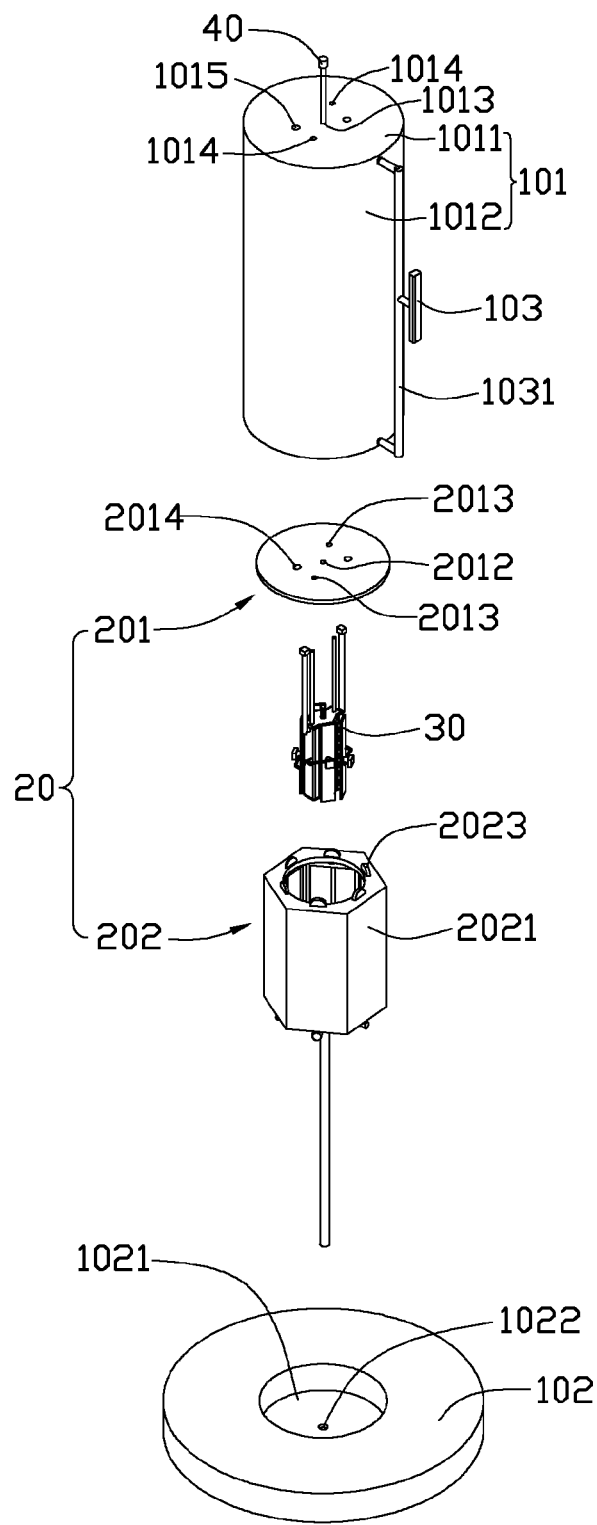
FIG. 3 is similar to FIG. 2, but viewed from another aspect.

Referring to FIGS. 1 through 3, an embodiment of a chemical vapor deposition (CVD) device 100 includes a reaction chamber 10, a support device 20, a gas input assembly 30, and a gas output assembly 40. The support device 20 is positioned in the reaction chamber 10. The gas input assembly 30 and the gas output assembly 40 are connected to the reaction chamber 10, respectively.

The reaction chamber 10 includes a main body 101, a cover 102 fixed on the main body 101, and a first light source 103 positioned at a side of the main body 101. The main body 101 is a substantially hollow cylinder, and includes a bottom surface 1011 and a sleeve 1021 extending from an edge of the bottom surface 1011. The bottom surface 1011 defines a first through hole 1013 in a center, and two second through holes 1014 and two third through holes 1015 arranged around the first through hole 1013. The sleeve 1021 defines two light guide holes 1016 on opposite ends. The first light source 103 is connected to the light guide holes 1016 via light guiding conduits 1031. Light emitted from the light source 103 passes through the light guiding conduits 1031 to reach the reaction chamber 10. In the illustrated embodiment, the first light source 103 is a mercury-vapor lamp. A center of the cover 102 defines a circular receiving groove 1021 and a connecting hole 1022 communicating with the receiving groove 1021.

The support device 20 includes a base plate 201, a support member 202, and an exhaust conduit 203. The base plate 201 is circular and defines a threaded hole 2012 in a center thereof and an annular sliding groove 2011 surrounding the threaded hole 2012. The base plate 201 further defines two first assembly holes 2013 and two second assembly holes 2014 between the sliding groove 2011 and the threaded hole 2012. The support member 202 is a hollow tube, and includes a plurality of connected sidewalls 2021. In the illustrated embodiment, the support member is hexagonal in cross-section. Each sidewall 2021 defines an absorbing groove 2022. A plurality of wheels 2023 is positioned on an end of the support member 202. When the wheels 2023 are received in the sliding groove 2011, the support member 202 is rotatable relative to the base plate 201. The exhaust conduit 203 is positioned on an end of the support member 202 away from the wheels 2023, and communicates with the absorbing grooves 2022. A gas output pump 204 is connected to the exhaust conduit 203. When the gas output pump 204 is in operation, a substrate to be treated is fixed to the sidewalls 2021. In the illustrated embodiment, the gas output pump 204 is a gas pump.

Figure 4:
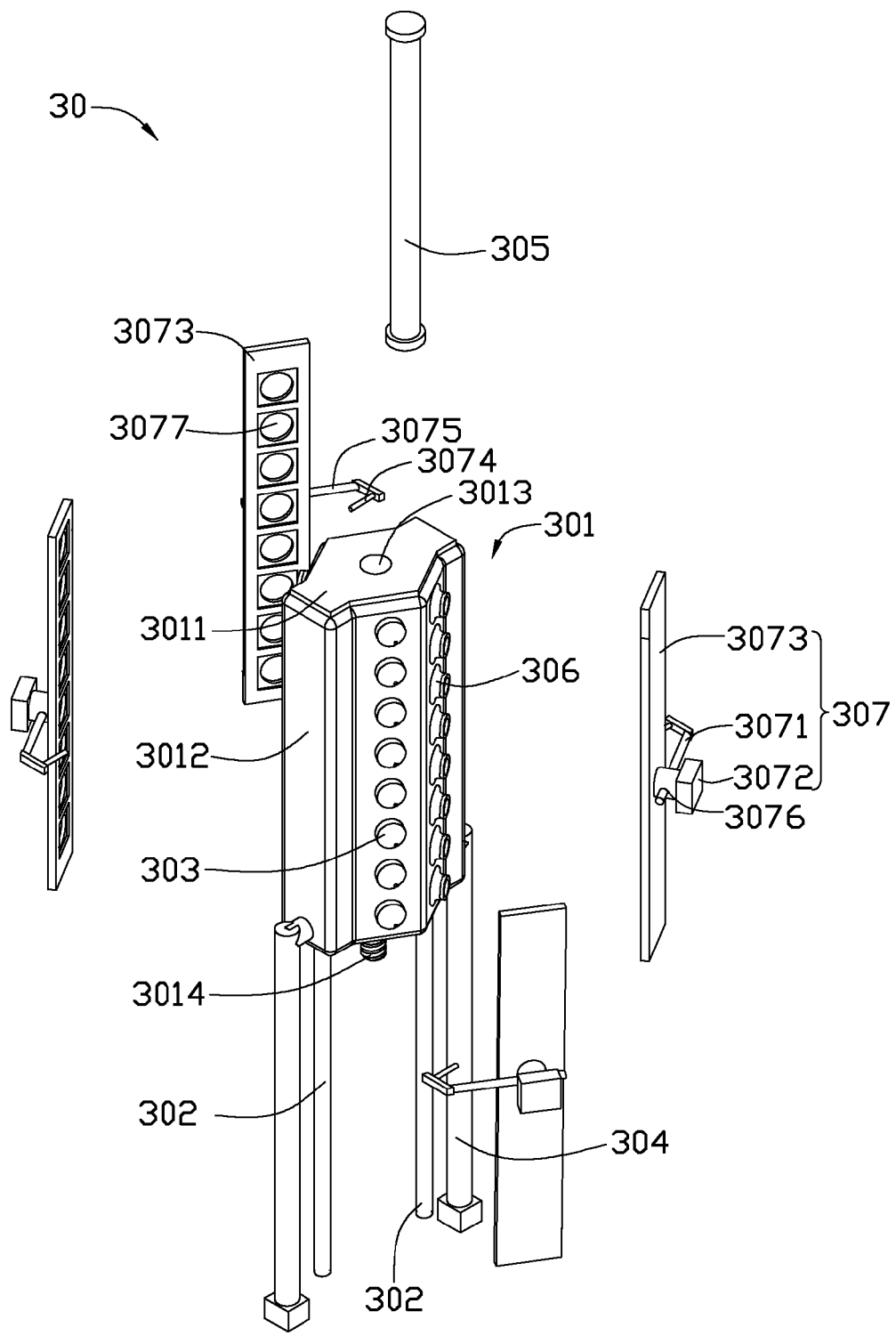
FIG. 4 is an exploded, isometric view of a gas input assembly of the CVD device of FIG. 2

Referring to FIG. 4, the gas input assembly 30 is positioned in a support member 202 of the support device 20. The gas input assembly 30 includes a main body 301, two gas input conduits 302, a plurality of gas jets 303, two heating members 304, a second light source 305, a plurality of light guide members 306 and a plurality of shielding assemblies 307.

The main body 301 includes a bottom surface (not labeled), a top surface 3011 parallel to the bottom surface, and a plurality of sidewalls 3012 connecting the bottom surface and the top surface 3011. The top surface 3011 defines a receiving hole 3013. A fastener 3014 is positioned on the bottom surface, and configured to be received in the threaded hole 2012 of the base plate 201, thereby fixing the main body 301 on the base plate 201.

Each gas input conduit 302 extends through the through hole 1014 of the main body 101 and the first assembly hole 2013 of the base plate 201, and is connected to an external gas source. The gas jets 303 are uniformly positioned on the sidewalls 3012 of the main body 301, and communicate with the gas input conduits 302. In the illustrated embodiment, the gas input assembly 30 includes sixteen gas jets 303 positioned on opposite sidewalls 3012.

Each heating member 304 extends through the second assembly hole 2014 of the base plate 201 and the third through hole 1015 of the main body 101, and is fixed to the main body 301. The heating member 304 is capable of heating the reacting gas input by the gas input conduits 302.

The second light source 305 is substantially cylindrical with a diameter substantially equal to that of the receiving hole 3013. The second light source 305 extends through the receiving hole 3013 into the main body 301. In the illustrated embodiment, the second light source 305 is a low pressure mercury-vapor lamp.

Each light guide member 306 is substantially a frustum taper shape, and positioned on the sidewall 3012 of the main body 301. The light guide members 306 are configured for guiding light from the second light source 305, positioned in the main body 301, to the support member 202. In the illustrated embodiment, the gas input assembly 30 includes sixteen light guide members 306 positioned on opposite sidewalls 3012.

Each shielding assembly 307 includes a sliding post 3071, a sliding member 3072 and a shielding cover 3073. The sliding post 3071 includes a fixing portion 3074 and a main portion 3075. The fixing portion 3074 is fixed to the sidewall 3012, and the main portion 3075 is substantially parallel to a corresponding sidewall 3012. The sliding member 3072 defines a guide hole 3076, in which the main portion 3075 is received. The shielding cover 3073 is a rectangular plate fixed to the sliding member 3072. The shielding cover 3073 together with the sliding member 3072 is slidable on the main portion 3075, so that the shielding cover 3073 can cover or uncover the gas jets 303 and the light guide members 306. Each shielding cover 3073 evenly forms a plurality of shielding portions 3077 corresponding to the gas jets 303 and the light guide members 306.

The exhaust device 40 extends through the first through hole 1013, and exhausts gas from the reaction chamber 10 after reaction.

In use, a plurality of substrates (not shown) is positioned in the support member 202, and attached to the sidewalls 2021 of the support member 202. The gas output pump 204 operates, and the substrates are firmly fixed to the sidewalls 2021 by vacuum effect. The support device 20 is rotated relative to the gas input assembly 30 by a driving device (not shown). As a result, the substrates rotate relative to the gas input assembly 30 in CVD.

The gas input assembly 30 is initiated and mixed gas is introduced to the reaction chamber 10. The first light source 103 and the second light source 305 are turned on, and the heating members 304 start to heat the mixed gas, which in turn reacts in the reaction chamber 10 to produce solid deposition on the substrates. The exhaust device 40 exhausts the gas from the reaction chamber 10 after reaction, enabling continuous deposition.

It should be pointed out that the gas jets 303 and the light guide members 306 can be partly covered with the shielding cover 3073 to control the speed and thickness of deposition.

The CVD device 100 includes a plurality of gas jets 303 introducing the mixed gas uniformly in the reaction chamber 10. As a result, thickness of the deposited film is further normalized. In addition, the CVD device 100 has a second light source 305 and a plurality of light guide members 306, (except the first light source 103) thus light is uniform in the CVD device 100, to generate a uniform film. The gas jets 303 and the light guide members 306 can be partly covered with the shielding cover 3073, to control the speed of deposition, enhancing quality of the deposition.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A CVD device, comprising:
a reaction chamber;
a support device positioned in the reaction chamber; and
a gas input assembly and a gas output assembly connected to the reaction chamber, respectively;
wherein the gas input assembly comprises a main body positioned in the reaction chamber, a plurality of gas jets uniformly positioned on the main body, and a plurality of shielding assemblies positioned on the main body, the gas jets introducing gas to the reaction chamber, each shielding assembly comprising a sliding post, a sliding member slidably sleeved on the sliding post, and a shielding cover fixed on the sliding member; and
a second light source received in the main body, and a plurality of light guide members positioned on the main body, and guiding light emitted from the second light source out of the main body, the shielding assemblies covering the gas jets and the light guide members.

2. The CVD device of claim 1, wherein the support device comprises a base plate and a support member rotatably connected to the base plate; the gas input assembly is positioned on the base plate, and the gas jets are positioned in the support member.

3. The CVD device of claim 2, wherein a plurality of wheels is positioned on an end of the support member, and the base plate defines a sliding groove in which the wheels are received.

4. The CVD device of claim 2, wherein the support member comprises a plurality of sidewalls and an exhaust conduit, wherein the sidewalls define a plurality of absorbing grooves communicating with the exhaust conduit.

5. The CVD device of claim 4, further comprising a gas output pump communicating with the exhaust conduit.

6. The CVD device of claim 2, wherein the gas input assembly further comprises a plurality of gas input conduits positioned on the main body, the plurality of gas input conduits communicating with the plurality of the gas jets respectively.

7. The CVD device of claim 6, further comprising a first light source, wherein the reaction chamber defines two light guide holes on opposite ends; the first light source is connected to the light guide holes via light guiding conduits.

8. The CVD device of claim 1, wherein the shielding cover evenly forms a plurality of shielding portions shielding the jets and the light guide members.

9. The CVD device of claim 1, wherein the gas input assembly comprises heating members connected to the main body.

10. The CVD device of claim 6, wherein the reaction chamber comprises a chamber main body comprising a bottom surface, the bottom surface defining a first through hole in a center thereof, and two second through holes and two third through holes arranged around the first through hole, the base plate defining a threaded hole in a center thereof, and two first assembly holes and two second assembly holes arranged around the threaded hole, the plurality of gas input conduits comprising two gas input conduits, each gas input conduit extending through the second through holes and the first assembly hole, and connected to an external gas source.

11. The CVD device of claim 10, wherein the gas input assembly further comprises two heating members, each heating member extending through the second assembly hole and the third through hole, and fixed to the main body.

12. The CVD device of claim 11, wherein the gas output assembly extends through the first through hole, and is configured for exhausting gas from the reaction chamber after reaction.

13. The CVD device of claim 12, wherein a fastener is positioned on a bottom surface of the main body of the gas input assembly, and configured to be received in the threaded hole of the base plate, thereby fixing the main body of the gas input assembly on the base plate.

* * * * *